(12) United States Patent
Nadimpally

(10) Patent No.: US 11,581,843 B2
(45) Date of Patent: Feb. 14, 2023

(54) SOLAR ROOF TILE FREE OF BACK ENCAPSULANT LAYER

(71) Applicant: Tesla, Inc., Austin, TX (US)

(72) Inventor: Bhavananda R. Nadimpally, San Jose, CA (US)

(73) Assignee: TESLA, INC., Austin, TX (US)

( * ) Notice: Subject to any disclaimer, the term of this patent is extended or adjusted under 35 U.S.C. 154(b) by 220 days.

(21) Appl. No.: 16/132,140

(22) Filed: Sep. 14, 2018

(65) Prior Publication Data

US 2020/0091857 A1 Mar. 19, 2020

(51) Int. Cl.
  *H02S 20/25* (2014.01)
  *H02S 30/10* (2014.01)
  *H01L 51/00* (2006.01)
  *H01L 31/18* (2006.01)
  *H01L 31/049* (2014.01)

(52) U.S. Cl.
  CPC ............ *H02S 20/25* (2014.12); *H01L 31/049* (2014.12); *H01L 31/186* (2013.01); *H01L 51/0008* (2013.01); *H02S 30/10* (2014.12)

(58) Field of Classification Search
  CPC ............ H01L 31/0488; H01L 31/0508; H01L 31/0504; H02S 20/22–26; H02S 40/36
  See application file for complete search history.

(56) References Cited

U.S. PATENT DOCUMENTS

| 3,076,861 A | 2/1963 | Samulon |
| 3,369,939 A | 2/1968 | Myer |
| 3,461,602 A | 8/1969 | Heinz |
| 4,239,810 A | 12/1980 | Alameddine |
| 4,400,577 A | 8/1983 | Spear |
| 4,724,011 A | 2/1988 | Turner |
| 5,118,540 A | 6/1992 | Hutchison |
| 5,338,369 A | 8/1994 | Rawlings |
| 5,427,961 A | 6/1995 | Takenouchi |
| 5,667,596 A | 9/1997 | Tsuzuki |
| 5,942,048 A | 8/1999 | Fujisaki |
| 6,133,522 A | 10/2000 | Kataoka |
| 6,311,436 B1 | 11/2001 | Mimura |
| 6,365,824 B1 | 4/2002 | Nakazima |
| 6,472,594 B1 | 10/2002 | Ichinose |
| 6,586,271 B2 | 7/2003 | Hanoka |

(Continued)

FOREIGN PATENT DOCUMENTS

| CN | 102544380 | 8/2015 |
| CN | 103426957 | 3/2016 |

(Continued)

OTHER PUBLICATIONS

Bulucani et al., "A new approach: low cost masking material and efficient copper metallization for higher efficiency silicon solar cells" 2015 IEEE.

(Continued)

*Primary Examiner* — Edward J. Schmiedel
(74) *Attorney, Agent, or Firm* — Dentons US LLP

(57) ABSTRACT

One embodiment can provide a photovoltaic roof tile. The photovoltaic roof tile can include a front glass cover, a back glass cover, a plurality of photovoltaic structures positioned between the front and back glass covers, and a single encapsulant layer positioned between the front glass cover and the photovoltaic structures. A surface of the photovoltaic structures is in direct contact with the back glass cover.

14 Claims, 18 Drawing Sheets

(56) References Cited

U.S. PATENT DOCUMENTS

| | | |
|---|---|---|
| 6,960,716 B2 | 11/2005 | Matsumi |
| 7,259,321 B2 | 8/2007 | Oswald |
| 7,276,724 B2 | 10/2007 | Sheats |
| 7,506,477 B2 | 3/2009 | Flaherty |
| 7,534,956 B2 | 5/2009 | Kataoka |
| 7,772,484 B2 | 8/2010 | Li |
| 7,833,808 B2 | 11/2010 | Xu |
| 7,851,700 B2 | 12/2010 | Luch |
| 7,858,874 B2 | 12/2010 | Ruskin |
| 7,902,451 B2 | 3/2011 | Shimizu |
| 7,964,440 B2 | 6/2011 | Salleo |
| 8,205,400 B2 | 6/2012 | Allen |
| 8,206,664 B2 | 6/2012 | Lin |
| 8,276,329 B2 | 10/2012 | Lenox |
| 8,471,141 B2 | 6/2013 | Stancel |
| 8,664,030 B2 | 3/2014 | Luch |
| 8,674,377 B2 | 3/2014 | Farquhar |
| 8,701,360 B2 | 4/2014 | Ressler |
| 8,713,861 B2 | 5/2014 | Desloover |
| 8,822,810 B2 | 9/2014 | Luch |
| 9,038,330 B2 | 5/2015 | Bellavia |
| 9,150,966 B2 | 10/2015 | Xu |
| 9,206,520 B2 | 12/2015 | Barr |
| 9,343,592 B2 | 5/2016 | Hunt |
| 9,362,527 B2 | 6/2016 | Takemura |
| 9,412,884 B2 | 8/2016 | Heng |
| 9,525,092 B2 | 12/2016 | Mayer |
| 9,825,582 B2 | 11/2017 | Fernandes |
| 9,899,554 B2 | 2/2018 | Yang |
| 9,966,487 B2 | 5/2018 | Magnusdottir |
| 2001/0054435 A1 | 12/2001 | Nagao |
| 2002/0015782 A1 | 2/2002 | Abys |
| 2003/0019518 A1 | 1/2003 | Shimizu et al. |
| 2003/0180983 A1 | 9/2003 | Oswald |
| 2004/0261840 A1 | 12/2004 | Schmit |
| 2005/0039788 A1 | 2/2005 | Blieske |
| 2005/0268963 A1 | 12/2005 | Jordan |
| 2006/0048798 A1 | 3/2006 | McCoy |
| 2006/0086620 A1 | 4/2006 | Chase |
| 2006/0204730 A1 | 9/2006 | Nakamura |
| 2008/0023069 A1* | 1/2008 | Terada ................ H01L 31/0512 136/256 |
| 2008/0053511 A1 | 3/2008 | Nakamura |
| 2008/0135085 A1 | 6/2008 | Corrales |
| 2008/0302030 A1* | 12/2008 | Stancel ............. H01L 31/02008 52/173.3 |
| 2009/0056803 A1* | 3/2009 | Nakai .................. H01L 31/048 136/256 |
| 2009/0101192 A1 | 4/2009 | Kothari |
| 2009/0120497 A1 | 5/2009 | Schetty |
| 2009/0133739 A1 | 5/2009 | Shiao |
| 2009/0133740 A1 | 5/2009 | Shiao |
| 2009/0233083 A1 | 9/2009 | Inoue |
| 2009/0242021 A1 | 10/2009 | Petkie |
| 2009/0287446 A1 | 11/2009 | Wang |
| 2009/0308435 A1 | 12/2009 | Caiger |
| 2010/0000603 A1 | 1/2010 | Tsuzuki |
| 2010/0006147 A1 | 1/2010 | Nakashima |
| 2010/0018568 A1 | 1/2010 | Nakata |
| 2010/0132762 A1 | 6/2010 | Graham |
| 2010/0147363 A1 | 6/2010 | Huang |
| 2010/0180929 A1 | 7/2010 | Raymond |
| 2011/0011444 A1* | 1/2011 | Hanoka ................ H01L 31/049 136/246 |
| 2011/0023937 A1 | 2/2011 | Daniel |
| 2011/0023942 A1 | 2/2011 | Soegding |
| 2011/0030761 A1 | 2/2011 | Kalkanoglu |
| 2011/0192826 A1* | 8/2011 | Von Moltke ......... B23K 1/0056 219/121.64 |
| 2011/0197953 A1* | 8/2011 | Pfeuffer ................ C23C 24/04 136/249 |
| 2011/0277825 A1 | 11/2011 | Fu |
| 2012/0012162 A1 | 1/2012 | Kobayashi |
| 2012/0031470 A1 | 2/2012 | Dimov |
| 2012/0048349 A1 | 3/2012 | Metin |
| 2012/0060911 A1 | 3/2012 | Fu |
| 2012/0125391 A1 | 5/2012 | Pinarbasi |
| 2012/0199184 A1 | 8/2012 | Nie |
| 2012/0237670 A1 | 9/2012 | Lim |
| 2013/0048062 A1 | 2/2013 | Min |
| 2013/0061913 A1 | 3/2013 | Willham |
| 2013/0160823 A1 | 6/2013 | Khouri |
| 2013/0206213 A1 | 8/2013 | He |
| 2013/0209776 A1 | 8/2013 | Kim |
| 2013/0233378 A1 | 9/2013 | Moslehi |
| 2013/0247959 A1 | 9/2013 | Kwon |
| 2013/0255755 A1 | 10/2013 | Chich |
| 2013/0280521 A1 | 10/2013 | Mori |
| 2014/0120699 A1 | 5/2014 | Hua |
| 2014/0124014 A1 | 5/2014 | Morad |
| 2014/0196768 A1 | 7/2014 | Heng et al. |
| 2014/0313574 A1 | 10/2014 | Bills |
| 2014/0360582 A1 | 12/2014 | Cui |
| 2015/0090314 A1 | 4/2015 | Yang |
| 2015/0155824 A1 | 6/2015 | Chien |
| 2015/0194552 A1 | 7/2015 | Ogasahara |
| 2015/0243818 A1* | 8/2015 | Kim ................... H01L 31/02008 136/244 |
| 2015/0243931 A1 | 8/2015 | Fukuura |
| 2015/0270410 A1* | 9/2015 | Heng ................... H01L 31/0504 136/251 |
| 2015/0349145 A1 | 12/2015 | Morad |
| 2015/0349152 A1 | 12/2015 | Voss |
| 2015/0349703 A1 | 12/2015 | Morad |
| 2015/0380571 A1* | 12/2015 | Shin ................... H01L 31/0516 136/244 |
| 2016/0013329 A1 | 1/2016 | Brophy |
| 2016/0105144 A1 | 4/2016 | Haynes |
| 2016/0163902 A1 | 6/2016 | Podlowski |
| 2016/0181446 A1 | 6/2016 | Kalkanoglu |
| 2016/0181454 A1* | 6/2016 | Son ................... H01L 31/0516 136/251 |
| 2016/0225931 A1 | 8/2016 | Heng |
| 2017/0033250 A1 | 2/2017 | Ballif |
| 2017/0077343 A1 | 3/2017 | Morad |
| 2017/0194516 A1 | 7/2017 | Reddy |
| 2017/0222082 A1 | 8/2017 | Lin |
| 2018/0166601 A1 | 6/2018 | Inaba |
| 2020/0007073 A1 | 1/2020 | Nguyen et al. |

FOREIGN PATENT DOCUMENTS

| | | |
|---|---|---|
| CN | 102956730 | 6/2016 |
| DE | 102007054124 | 5/2009 |
| EP | 1058320 | 12/2000 |
| EP | 2051124 A2 | 4/2009 |
| EP | 2709160 | 3/2014 |
| GB | 2278618 | 12/1994 |
| JP | S57141979 | 9/1982 |
| JP | S6020586 | 2/1985 |
| JP | H06140657 | 5/1994 |
| JP | H06264571 | 9/1994 |
| JP | 2000091610 | 3/2000 |
| JP | 2000216415 | 8/2000 |
| JP | 2013211385 | 10/2013 |
| WO | 2008136872 | 11/2008 |
| WO | 2009062106 | 5/2009 |
| WO | 2009099418 | 8/2009 |
| WO | 2010128375 | 11/2010 |
| WO | 2011128757 | 10/2011 |
| WO | 201359441 | 4/2013 |
| WO | 2013067541 | 5/2013 |
| WO | 2013102181 | 7/2013 |
| WO | 2014178180 | 11/2014 |
| WO | 2015155356 | 10/2015 |
| WO | 2016090341 | 6/2016 |

OTHER PUBLICATIONS

Fan et al., "Laser micromachined wax-covered plastic paper as both sputter deposition shadow masks and deep-ultraviolet patterning

(56) References Cited

OTHER PUBLICATIONS masks for polymethylmacrylate-based microfluidic systems" via google scholar, downloaded Mar. 31, 2016.
"An inorganic/organic hybrid coating for low cost metal mounted dye-sensitized solar cells" Vyas, N. et al.
"Recovery Act: Organic Coatings as Encapsulants for Low Cost, High Performance PV Modules" Jim Poole et al. Nov. 16, 2011.
Pelisset: "Efficiency of Silicon Thin-Film photovoltaic Modules with a Front Coloured Glass", Proceedings CISBAT 2011, Jan. 1, 2011, pp. 37-42, XP055049695, the Whole Document.
Non-Final Office Action received for U.S. Appl. No. 16/023,480, dated Mar. 5, 2020, 15 pages.

* cited by examiner

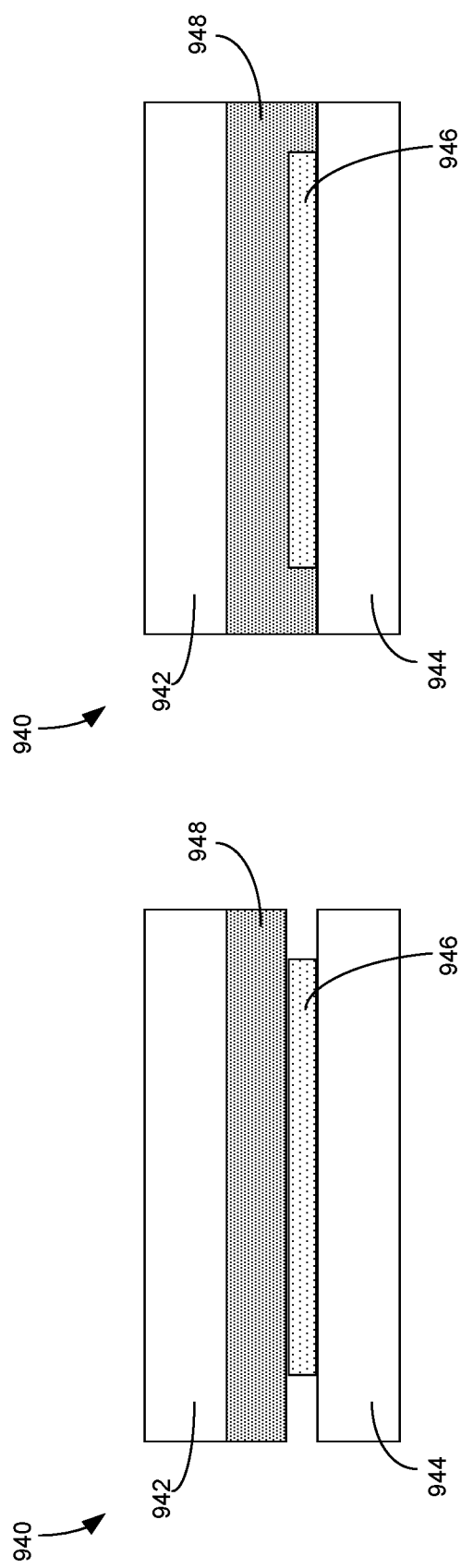

SOLAR ROOF TILE FREE OF BACK ENCAPSULANT LAYER

BACKGROUND

Field

This disclosure is generally related to photovoltaic (or "PV") tiles. More specifically, this disclosure is related to photovoltaic roof tiles free of a back encapsulate layer.

Related Art

In residential and commercial solar energy installations, a building's roof typically is installed with photovoltaic (PV) modules, also called PV or solar panels, that can include a two-dimensional array (e.g., 6×12) of solar cells. A PV roof tile (or solar roof tile) can be a particular type of PV module offering weather protection for the home and a pleasing aesthetic appearance, while also functioning as a PV module to convert solar energy to electricity. The PV roof tile can be shaped like a conventional roof tile and can include one or more solar cells encapsulated between a front cover and a back cover, but typically encloses fewer solar cells than a conventional solar panel.

The front and back covers can be fortified glass or other material that can protect the PV cells from the weather elements. Note that a typical roof tile may have a dimension of 15 in×8 in=120 in$^2$=774 cm$^2$, and a typical solar cell may have a dimension of 6 in×6 in=36 in$^2$=232 cm$^2$. Similar to a conventional PV panel, the PV roof tile can include two encapsulant layers, a front encapsulant layer between the front cover and the solar cells and a back encapsulant layer between the back cover and the solar cells. A lamination process can seal the solar cells between the front and back covers.

SUMMARY

One embodiment can provide a photovoltaic roof tile. The photovoltaic roof tile can include a front glass cover, a back glass cover, a plurality of photovoltaic structures positioned between the front and back glass covers, and a single encapsulant layer positioned between the front glass cover and the photovoltaic structures. A surface of the photovoltaic structures is in direct contact with the back glass cover.

In a variation on this embodiment, a respective photovoltaic structure can include a first edge busbar positioned near an edge of a first surface and a second edge busbar positioned near an opposite edge of a second surface, and the plurality of photovoltaic structures can be arranged in such a way that the first edge busbar of a first photovoltaic structure overlaps the second edge busbar of an adjacent photovoltaic structure, thereby resulting in the plurality of photovoltaic structures forming a serially coupled string.

In a further variation, the photovoltaic roof tile can further include a bridge electrode configured to couple to an edge busbar of the serially coupled string.

In a variation on this embodiment, the back glass cover can further include a glass substrate and a pre-laid circuit electrically coupled to the plurality of photovoltaic structures. The pre-laid circuit can include a plurality of metallic strips that are attached to and in direct contact with the glass substrate.

In a further variation, the plurality of metallic strips can be deposited on the glass substrate using a metallization technique selected from a group consisting of: screen printing, electroplating, evaporation, and sputtering.

In a further variation, the pre-laid circuit can be configured to facilitate an in-series or in-parallel electrical coupling between the photovoltaic roof tile and an adjacent photovoltaic roof tile.

One embodiment can provide a photovoltaic roof tile module. The photovoltaic roof tile module can include a plurality of photovoltaic roof tiles mechanically and electrically coupled to each other. A respective photovoltaic roof tile can include a front glass cover, a back glass cover, a plurality of photovoltaic structures positioned between the front and back glass covers, and a single encapsulant layer positioned between the front glass cover and the photovoltaic structures. A surface of the photovoltaic structures is in direct contact with the back glass cover.

One embodiment can provide a method for fabricating a photovoltaic roof tile. The fabrication method can include obtaining a back glass cover; obtaining a cascaded string of photovoltaic structures; placing the cascaded string directly on the back glass cover so that a surface of the cascaded string is in direct contact with the back glass cover; placing an encapsulant layer and a front glass cover on top of the cascaded string; and performing a lamination operation to laminate together the front glass cover, the cascaded string, and the back glass cover.

A "solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," "smaller cell," or "strip" is a portion or segment of a photovoltaic structure, such as a solar cell. A photovoltaic structure may be divided into a number of strips. A strip may have any shape and any size. The width and length of a strip may be the same or different from each other. Strips may be formed by further dividing a previously divided strip.

"Finger lines," "finger electrodes," and "fingers" refer to elongated, electrically conductive (e.g., metallic) electrodes of a photovoltaic structure for collecting carriers.

"Busbar," "bus line," or "bus electrode" refer to elongated, electrically conductive (e.g., metallic) electrodes of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or a solar cell strip. A photovoltaic structure is not limited to a device fabricated by a particular method. For example, a photovoltaic structure can be a crystalline silicon-based solar cell, a thin film solar cell, an amorphous silicon-based solar cell, a polycrystalline silicon-based solar cell, or a strip thereof.

BRIEF DESCRIPTION OF THE FIGURES

FIG. 9C shows the cross section of a photovoltaic roof tile prior to lamination, according to one embodiment.

FIG. 9D shows the cross section of photovoltaic roof tile 940 after lamination, according to one embodiment.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the disclosed system is not limited to the embodiments shown, but is to be accorded the widest scope consistent with the principles and features disclosed herein.

Overview

Embodiments of the invention solve at least the technical problem of enabling low-cost fabrication of solar roof tiles or tile modules. More specifically, a novel solar roof tile can include only a single encapsulant layer that is positioned between the front cover of the tile and photovoltaic strips. The back surface of the photovoltaic strips can be in direct contact with the back cover, and the front surface of the photovoltaic strips can be covered by the single encapsulant layer, which can also cover areas of the back cover not covered by the photovoltaic strips. After lamination, the single encapsulant layer can seal the photovoltaic strips between the front and back covers by filling empty spaces between the front and back covers of the solar roof tile.

PV Roof Tiles and Multi-Tile Modules

A PV roof tile (or solar roof tile) is a type of PV module shaped like a roof tile and typically enclosing fewer solar cells than a conventional solar panel. Note that such PV roof tiles can function as both PV cells and roof tiles at the same time. PV roof tiles and modules are described in more detail in U.S. Provisional Patent Application No. 62/465,694, Attorney Docket No. P357-1PUS, entitled "SYSTEM AND METHOD FOR PACKAGING PHOTOVOLTAIC ROOF TILES" filed Mar. 1, 2017, which is incorporated herein by reference. In some embodiments, the system disclosed herein can be applied to PV roof tiles and/or other types of PV module.

Figure 1:
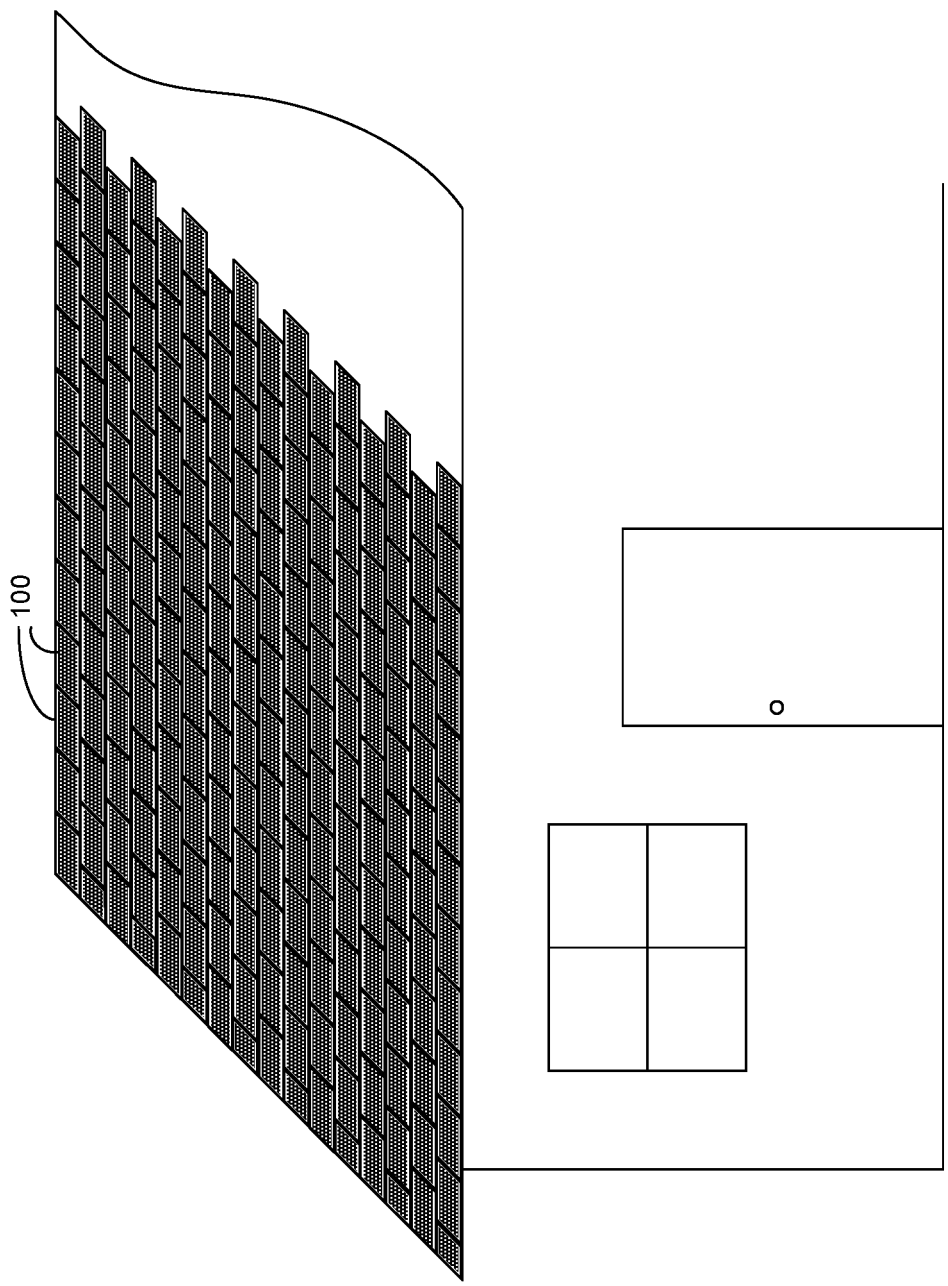
FIG. 1 shows an exemplary configuration of PV roof tiles on a house.

FIG. 1 shows an exemplary configuration of PV roof tiles on a house. PV roof tiles 100 can be installed on a house like conventional roof tiles or shingles. Particularly, a PV roof tile can be placed with other tiles in such a way as to prevent water from entering the building.

A PV roof tile can enclose multiple solar cells or PV structures, and a respective PV structure can include one or more electrodes, such as busbars and finger lines. The PV structures within a PV roof tile can be electrically and, optionally, mechanically coupled to each other. For example, multiple PV structures can be electrically coupled together by a metallic tab, via their respective busbars, to create serial or parallel connections. Moreover, electrical connections can be made between two adjacent tiles, so that a number of PV roof tiles can jointly provide electrical power.

Figure 2:
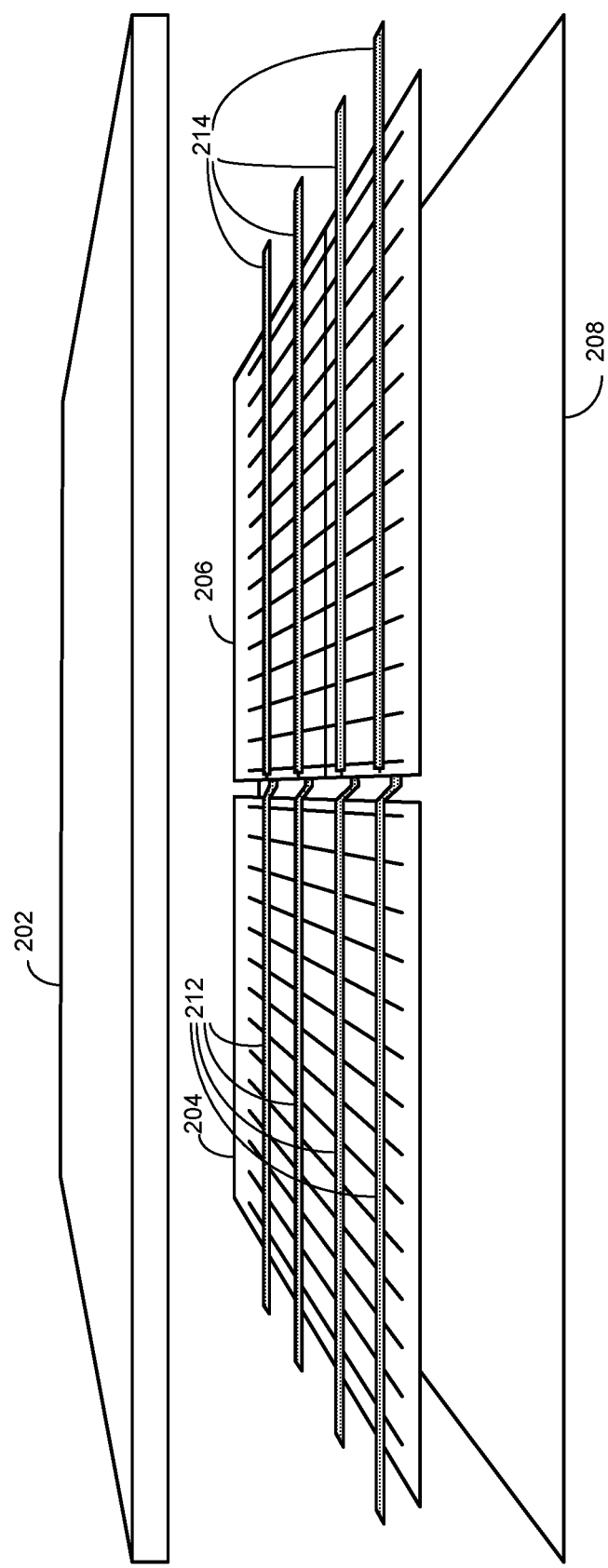
FIG. 2 shows the perspective view of an exemplary photovoltaic roof tile, according to an embodiment.

FIG. 2 shows the perspective view of an exemplary photovoltaic roof tile, according to an embodiment. Solar cells 204 and 206 can be hermetically sealed between top glass cover 202 and backsheet 208, which jointly can protect the solar cells from various weather elements. In the example shown in FIG. 2, metallic tabbing strips 212 can be in contact with the front-side electrodes of solar cell 204 and extend beyond the left edge of glass 202, thereby serving as contact electrodes of a first polarity of the PV roof tile. Tabbing strips 212 can also be in contact with the back of solar cell 206, creating a serial connection between solar cell 204 and solar cell 206. On the other hand, tabbing strips 214 can be in contact with front-side electrodes of solar cell 206 and extend beyond the right edge of glass cover 202, serving as contact electrodes of a second polarity of the PV roof tile.

Figure 3:
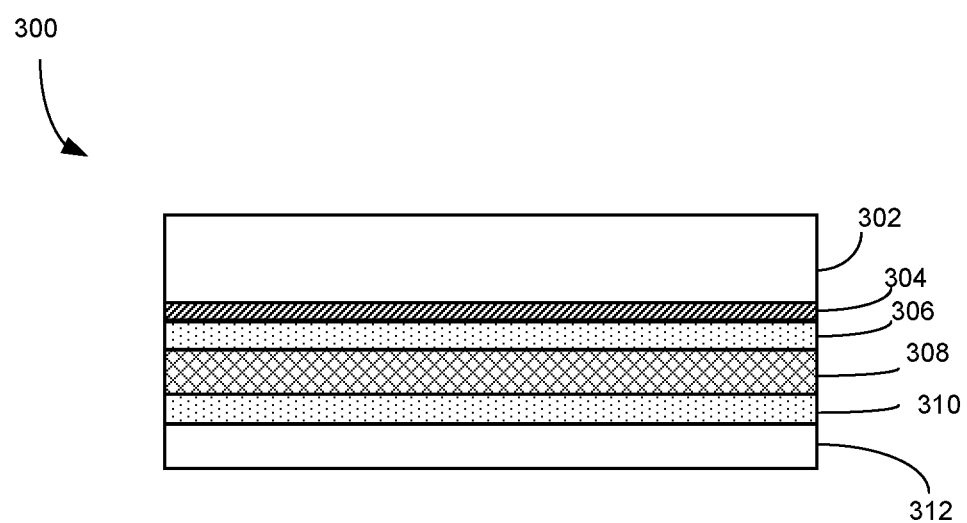
FIG. 3 shows a cross section of an exemplary photovoltaic roof tile, according to an embodiment.

FIG. 3 shows a cross section of an exemplary photovoltaic roof tile, according to an embodiment. Solar cell or array of solar cells 308 can be encapsulated between top glass cover 302 and back cover 312, which can be fortified glass or a regular PV backsheet. Top encapsulant layer 306, which can be based on a polymer, can be used to seal top glass cover 302 and solar cell or array of solar cells 308. Specifically, encapsulant layer 306 may include polyvinyl butyral (PVB), thermoplastic polyolefin (TPO), ethylene vinyl acetate (EVA), or N,N'-diphenyl-N,N'-bis(3-methylphenyl)-1,1'-diphenyl-4,4'-diamine (TPD). Similarly, lower encapsulant layer 310, which can be based on a similar material, can be used to seal array of solar cells 308 and back cover 312. A PV roof tile can also contain other optional layers, such as an optical filter or coating layer or a layer of nanoparticles for providing desired color appearances. In the example of FIG. 3, module or roof tile 300 also contains an optical filter layer 304.

Figure 4A:
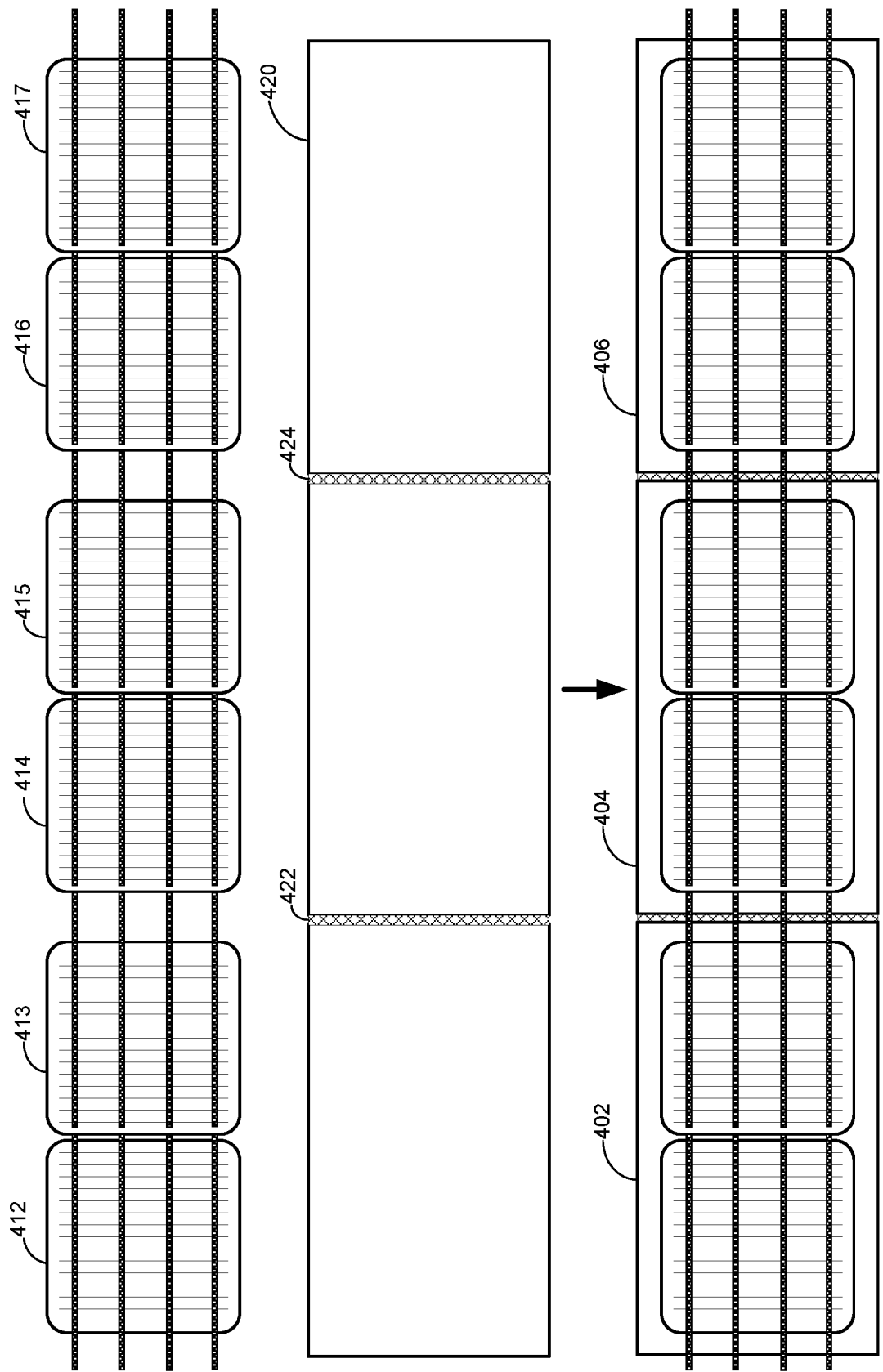
FIG. 4A illustrates an exemplary configuration of a multi-tile module, according to one embodiment.

To facilitate more scalable production and easier installation, multiple photovoltaic roof tiles can be fabricated together, while the tiles are linked in a rigid or semi-rigid way. FIG. 4A illustrates an exemplary configuration of a multi-tile module, according to one embodiment. In this example, three PV roof tiles 402, 404, and 406 can be manufactured together. During fabrication, solar cells 412 and 413 (corresponding to tile 402), 414 and 415 (corresponding to tile 404), and 416 and 417 (corresponding to tile 406) can be laid out with tabbing strips interconnecting their corresponding busbars, forming a connection in series. Furthermore, these six solar cells can be laid out on a common backsheet. Subsequently, front-side glass cover 420 can be sealed onto these six PV cells.

It is possible to use a single piece of glass as glass cover 420. In one embodiment, grooves 422 and 424 can be made on glass cover 420, so that the appearance of three separate roof tiles can be achieved. It is also possible to use three separate pieces of glass to cover the six cells, which are laid out on a common backsheet. In this case, gaps 422 and 424 can be sealed with an encapsulant material, establishing a semi-rigid coupling between adjacent tiles. Prefabricating multiple tiles into a rigid or semi-rigid multi-tile module can significantly reduce the complexity in roof installation, because the tiles within the module have been connected with the tabbing strips. Note that the number of tiles included in each multi-tile module can be more or fewer than what is shown in FIG. 4A.

Figure 4B:
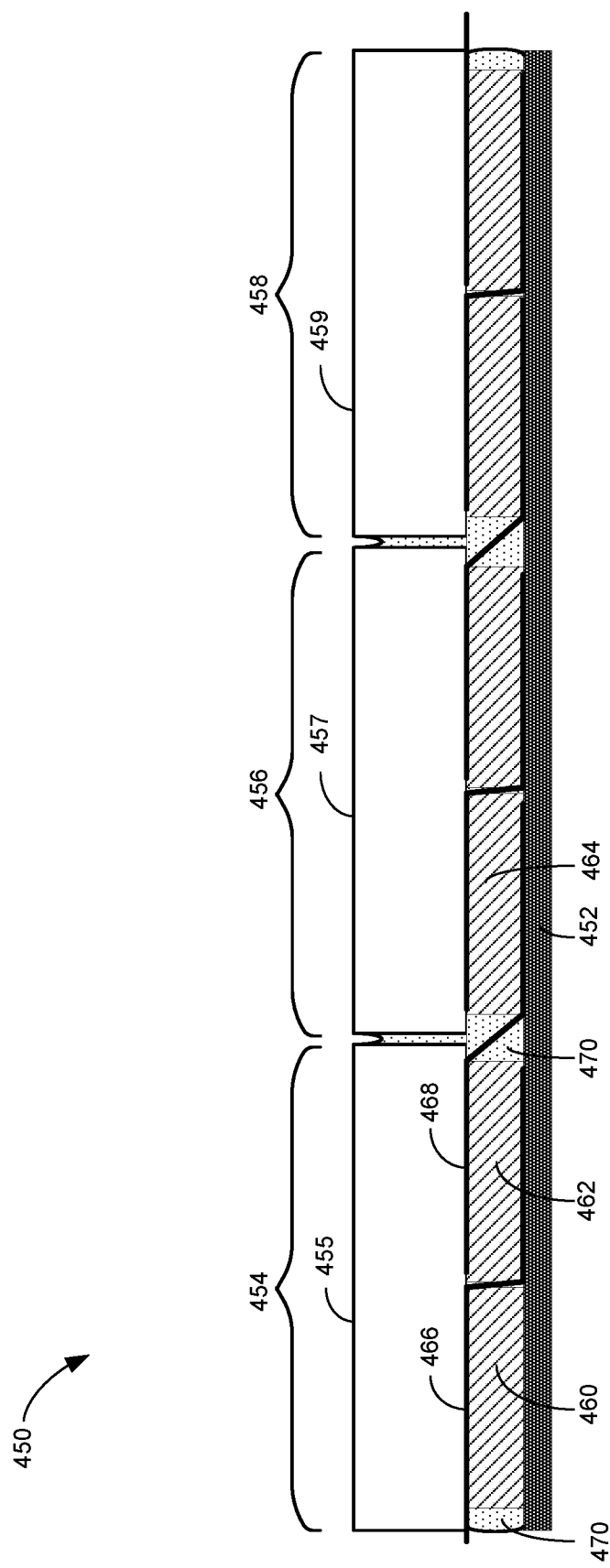
FIG. 4B illustrates a cross section of an exemplary multi-tile module, according to one embodiment.

FIG. 4B illustrates a cross section of an exemplary multi-tile module, according to one embodiment. In this example, multi-tile module 450 can include photovoltaic roof tiles 454, 456, and 458. These tiles can share common backsheet 452, and have three individual glass covers 455, 457, and 459, respectively. Each tile can encapsulate two solar cells. For example, tile 454 can include solar cells 460 and 462 encapsulated between backsheet 452 and glass cover 455. Tabbing strips can be used to provide electrical coupling within each tile and between adjacent tiles. For example, tabbing strip 466 can couple the front electrode of solar cell 460 to the back electrode of solar cell 462, creating a serial connection between these two cells. Similarly, tabbing strip 468 can couple the front electrode of cell 462 to the back electrode of cell 464, creating a serial connection between tile 454 and tile 456.

The gap between two adjacent PV tiles can be filled with encapsulant, protecting tabbing strips interconnecting the two adjacent tiles from the weather elements. For example, encapsulant 470 fills the gap between tiles 454 and 456, protecting tabbing strip 468 from weather elements. Furthermore, the three glass covers, backsheet 452, and the encapsulant together form a semi-rigid construction for multi-tile module 450. This semi-rigid construction can facilitate easier installation while providing a certain degree of flexibility among the tiles.

In addition to the examples shown in FIGS. 4A and 4B, a PV tile may include different forms of photovoltaic structures. For example, in order to reduce internal resistance, each square solar cell shown in FIG. 4A can be divided into multiple (e.g., three) smaller strips, each having edge busbars of different polarities on its two opposite edges. The edge busbars allow the strips to be cascaded one by one to form a serially connected string.

Figure 5A:
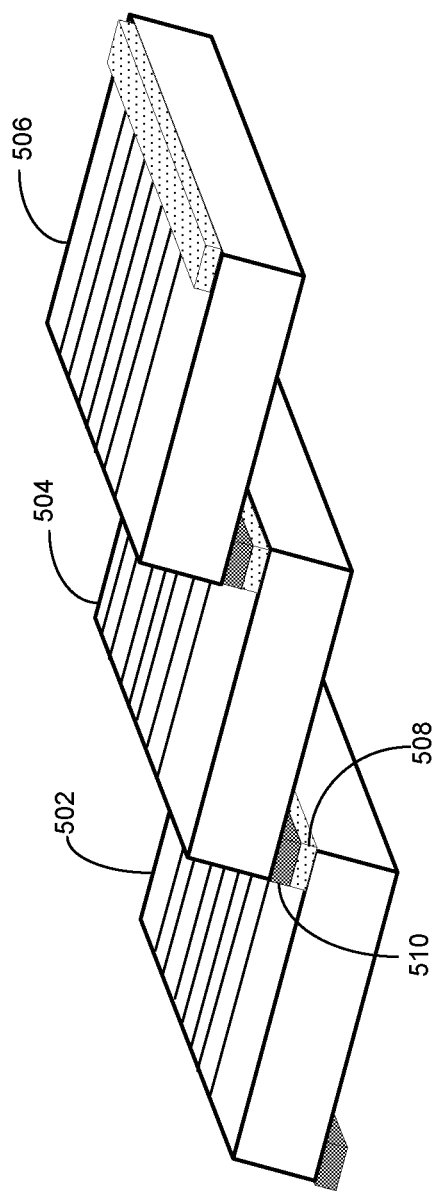
FIG. 5A illustrates a serial connection among three adjacent cascaded photovoltaic strips, according to one embodiment.

FIG. 5A illustrates a serial connection among three adjacent cascaded photovoltaic strips, according to one embodiment. In FIG. 5A, strips 502, 504, and 506 are stacked in such a way that strip 504 partially underlaps adjacent strip 506 to its right, and overlaps strip 502 to its left. The resulting string of strips forms a cascaded pattern similar to roof shingles. Strips 502 and 504 are electrically coupled in series via edge busbar 508 at the top surface of strip 502 and edge busbar 510 at the bottom surface of strip 504. Strips 502 and 504 can be arranged in such a way that bottom edge busbar 510 is above and in direct contact with top edge busbar 508. The coupling between strips 504 and 506 can be similar.

Figure 5B:
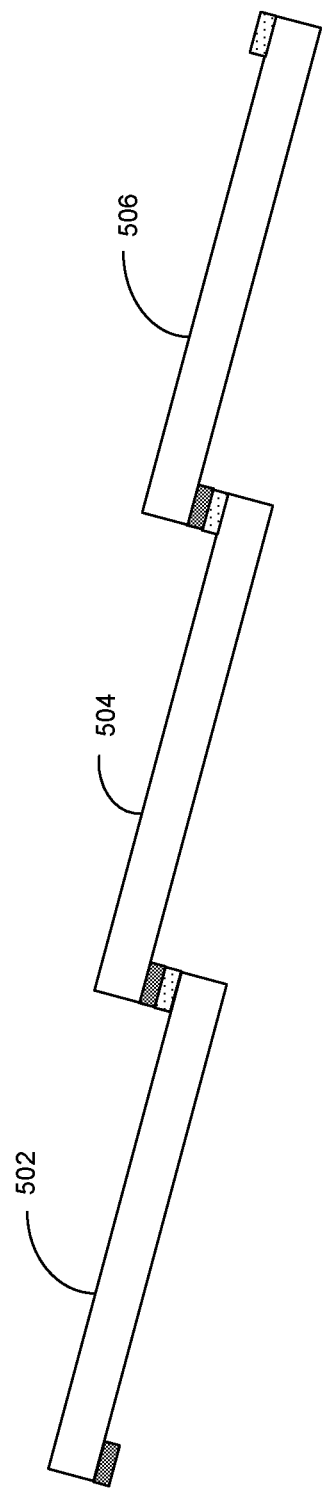
FIG. 5B illustrates the side view of the string of cascaded strips, according to one embodiment.

FIG. 5B illustrates the side view of the string of cascaded strips, according to one embodiment. In the example shown in FIGS. 5A and 5B, the strips can be segments of a six-inch square or pseudo-square solar cell, with each strip having a dimension of approximately two inches by six inches. To reduce shading, the overlapping between adjacent strips should be kept as small as possible. Therefore, in the example shown in FIGS. 5A and 5B, the single busbars (both at the top and the bottom surfaces) can be placed at or near the very edge of the strip. The same cascaded pattern can extend along multiple strips to form a serially connected string, and a number of strings can be coupled in series or parallel.

Figure 5C:
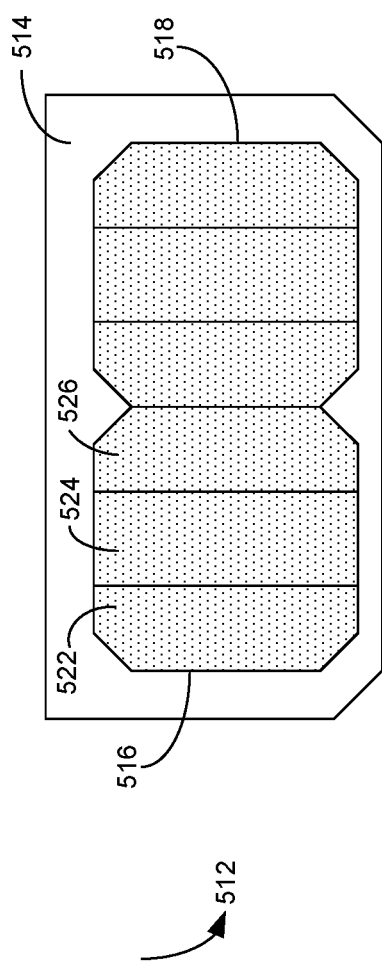
FIG. 5C illustrates an exemplary solar roof tile, according to one embodiment.

FIG. 5C illustrates an exemplary solar roof tile, according to one embodiment. A solar roof tile 512 includes top glass cover 514 and solar cells 516 and 518. The bottom cover (e.g., backsheet) of solar roof tile 512 is out of view in FIG. 5C. Solar cells 516 and 518 can be conventional square or pseudo-square solar cells, such as six-inch solar cells. In some embodiments, solar cells 516 and 518 can each be divided into three separate pieces of similar size. For example, solar cell 516 can include strips 522, 524, and 526. These strips can be arranged in such a way that adjacent strips are partially overlapped at the edges, similar to the ones shown in FIGS. 5A-5B. For simplicity of illustration, the electrode grids, including the finger lines and edge busbars, of the strips are not shown in FIG. 5C. In addition to the example shown in FIG. 5C, a solar roof tile can contain fewer or more cascaded strips, which can be of various shapes and size.

In some embodiments, multiple solar roof tiles, each encapsulating a cascaded string, can be assembled to obtain a multi-tile module. Inner-tile electrical coupling has been accomplished by overlapping corresponding edge busbars of adjacent strips. However, inter-tile electrical coupling within such a multi-tile module can be a challenge. Strain-relief connectors and long bussing strips have been used to facilitate inter-tile coupling. However, strain-relief connectors can be expensive, and arranging bussing strips after laying out the cascaded strings can be cumbersome. To facilitate low-cost, high-throughput manufacturing of the solar roof tiles, in some embodiments, metal strips can be pre-laid onto the back covers of the solar tiles, forming an embedded circuitry that can be similar to metal traces on a printed circuit board (PCB). More specifically, the embedded circuitry can be configured in such a way that it facilitates the electrical coupling among the multiple solar roof tiles within a multi-tile module.

Moreover, to facilitate electrical coupling between the embedded circuitry and an edge busbar situated on a front surface of a cascaded string, in some embodiments, a Si-based bridge electrode can be attached to the cascaded string. The Si-based bridge electrode can include a metallic layer covering its entire back surface and, optionally, a back edge busbar. By overlapping its edge (e.g., back edge busbar) to the front edge busbar of the cascaded string, the Si-based bridge electrode can turn itself into an electrode for the cascaded string, converting the forwardly facing electrode of the cascaded string to an electrode accessible from the back side of the cascaded string.

Figure 6:
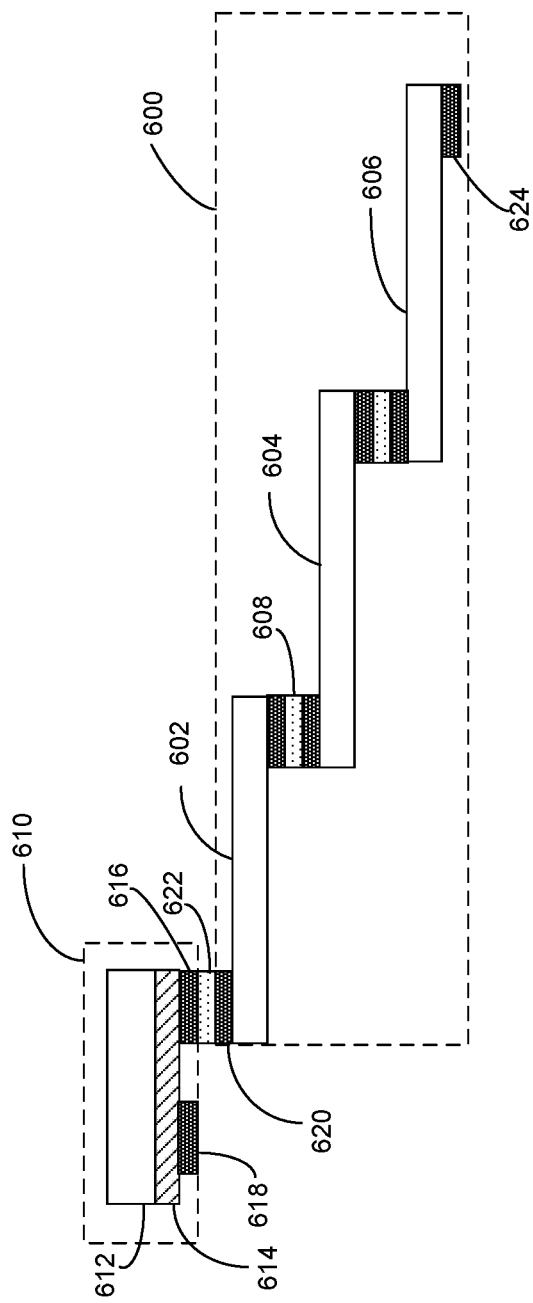
FIG. 6 shows the coupling between a Si-based bridge electrode and a cascaded string, according to one embodiment.

FIG. 6 shows the coupling between a Si-based bridge electrode and a cascaded string, according to one embodiment. In FIG. 6, cascaded string 600 can be coupled to Si-based bridge electrode 610. More specifically, cascaded string 600 can include photovoltaic structures 602, 604, and 606. Adjacent photovoltaic structures can overlap at their adjacent edges such that the corresponding edge busbars overlap and are bonded by an adhesive layer. For example, photovoltaic structures 602 and 604 overlap each other at the edges such that the bottom edge busbar of photovoltaic structure 602 overlaps the top edge busbar of photovoltaic structure 604. These two overlapping busbars can be bonded by adhesive layer 608. Si-based bridge electrode 610 can include a Si base layer 612, a full-back-contact layer 614, an edge busbar 616, and one or more contact pads 618. Bridge electrode 610 can couple to cascaded string 600 by overlapping edge busbar 616 with top edge busbar 620 of photovoltaic structure 602. Similarly, these two overlapping edge busbars can be bonded by adhesive layer 622. As one can see from FIG. 6, downwardly facing contact pads 618 of bridge electrode 610 and bottom edge busbar 624 of photovoltaic structure 606 are electrodes of two different polarities for cascaded string 600, and can be used to facilitate electrical coupling between cascaded string 600 and other cascaded strings.

Detailed descriptions of the Si-based bridge electrode can be found in U.S. patent application Ser. No. 16/006,645, filed Jun. 12, 2018 and entitled "SOLAR ROOF TILE CONNECTORS," the disclosure of which is incorporated herein by reference in its entirety.

Multi-Tile Modules with Pre-Laid Circuitry

Figure 7A:
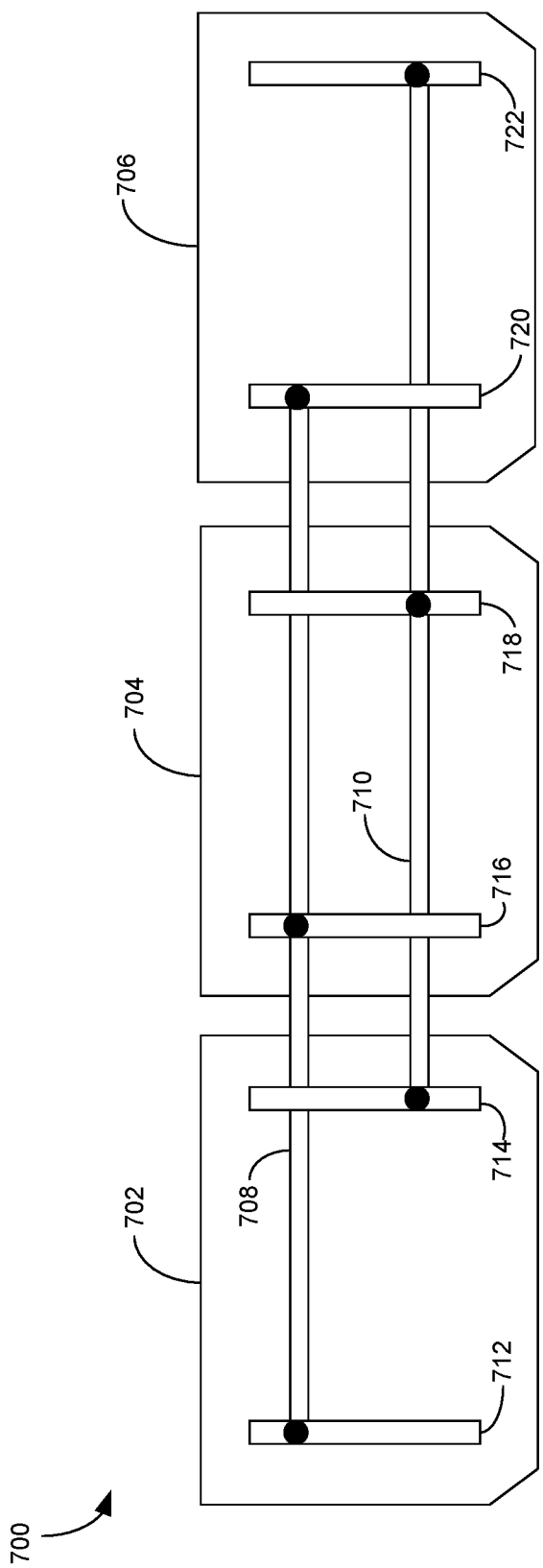
FIG. 7A shows back covers of the tiles of an exemplary multi-tile module, according to one embodiment.

FIG. 7A shows back covers of the tiles of an exemplary multi-tile module, according to one embodiment. In FIG. 7A, multi-tile module 700 includes a number of back tile covers (or, simply, back covers), e.g., back tile covers 702, 704, and 706. A number of metallic strips can be laid onto the surface of the back tile covers. In the example shown in FIG. 7A, two sets of metallic strips form a pre-laid circuitry. Each set of metallic strips can include multiple parallel metallic strips, and the two sets of metallic strips are perpendicular to each other. More specifically, a first set can include two metallic strips (e.g., metallic strips 708 and 710) running parallel to each other and across the multiple tiles. The second set can include six metallic strips, two per tile cover, running parallel to each other. More specifically, metallic strips 712 and 714 are located on back cover 702, metallic strips 716 and 718 on back cover 704, and metallic strips 720 and 722 on back cover 706.

In some embodiments, the second set of metallic strips can be arranged in such a way that they can electrically couple to the busbars of the cascaded strings. For example, metallic strips 712 and 714 can be arranged in specific locations such that, when a cascaded string is placed onto back tile cover 702, metallic strips 712 and 714 are directly under the bottom busbar and the bridge electrode of the cascaded string strip, forming electrical couplings. As a result, metallic strips 712 and 714 can become the positive and negative lead electrodes, respectively, of the cascaded string. The first set of metallic strips can then electrically couple to the second set of metallic strips to facilitate electrical coupling among cascaded strings belonging to the different tiles. By configuring the coupling between the first and second sets of metallic strips, different types of electrical couplings (e.g., in-series, in-parallel, or a combination thereof) can be achieved.

In the example shown in FIG. 7A, each of the first set of metallic strips is electrically coupled to metallic strips of the second set located near a same edge of the back covers. For example, metallic strip 708 is coupled to metallic strips located near the left edge of the back covers, i.e., metallic strips 712, 716, and 720, as shown by the solid circles. Similarly, metallic strip 710 is coupled to metallic strips located near the right edge of the back covers, i.e., metallic strips 714, 718, and 722. If the cascaded strings are laid on the back covers in a similar fashion (e.g., having same-polarity surfaces facing the same direction), the configuration shown in FIG. 7A will result in the cascaded strings being coupled to each other in parallel.

Figure 7B:
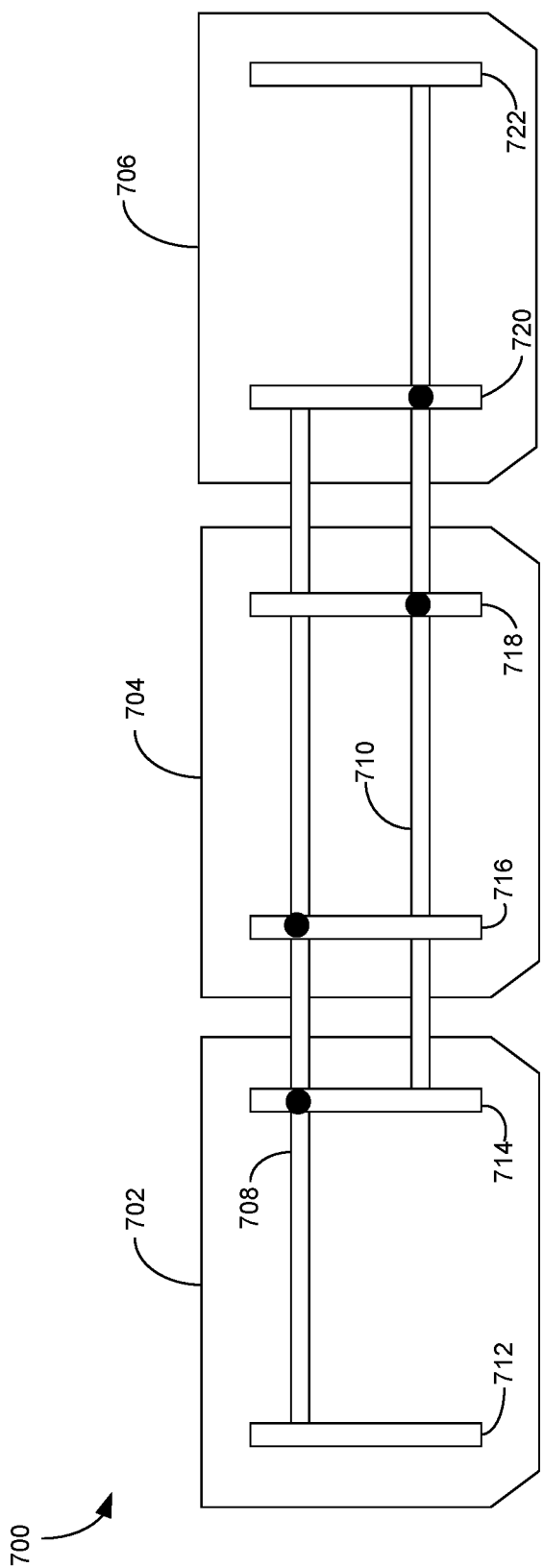
FIG. 7B shows back covers of the tiles of an exemplary multi-tile module, according to one embodiment.

Other configurations can also be possible. FIG. 7B shows back covers of the tiles of an exemplary multi-tile module, according to one embodiment. In the example shown in FIG. 7B, the layout of the first and second sets of metallic strips (i.e., metallic strips 708-722) can remain the same as in the example shown in FIG. 7A. However, the coupling between the first set of metallic strips and the second set of metallic strips can be different compared to the example shown in FIG. 7A. More specifically, in FIG. 7B, metallic strip 708 can be electrically coupled to metallic strips 714 and 716, as shown by the solid circles, whereas metallic strip 710 can be electrically coupled to metallic strips 718 and 720. This way, the different tiles in tile module 700 can be coupled to each other in series.

Figure 7C:
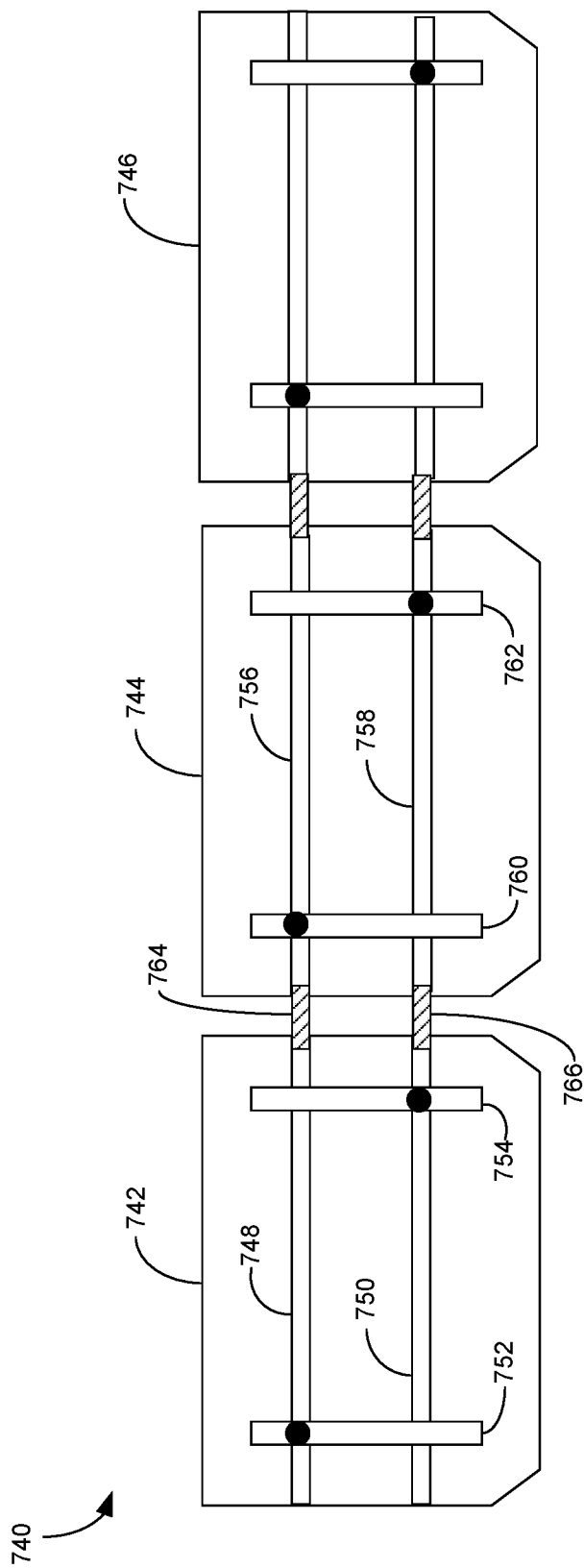
FIG. 7C shows back covers of the tiles of an exemplary multi-tile module, according to one embodiment.

In some embodiments, the metallic strips that form the pre-laid circuitry can include individual metal pieces that are simply placed on top of the back tile covers. In further embodiments, an adhesive can be used to bond the metallic strips to the back tile covers. In some embodiments, the metallic strips can include metal traces that are directly printed onto the back tile covers, which can be glass covers. Note that, in such a scenario, portions of the first set of metallic strips that are located between two adjacent glass covers may include separate metal pieces coupled to corresponding printed metal traces. FIG. 7C shows back covers of the tiles of an exemplary multi-tile module, according to one embodiment. In FIG. 7C, multi-tile module 740 can include back tile covers 742, 744, and 746. Each tile cover can include a number of printed metal traces. More specifically, each tile can include two lateral traces and two vertical traces. Note that the lateral direction in the drawing corresponds to the direction that the back tile covers are positioned with respect to each other. For example, back cover 742 can include lateral traces 748 and 750, and vertical traces 752 and 754.

Similarly, back cover 744 can include lateral traces 756 and 758, and vertical traces 760 and 762. The metal traces can be printed using various metallization techniques, such as screen printing or laser jet printing. In some embodiments, the metal traces can include Cu or Ag traces.

Figure 7D:
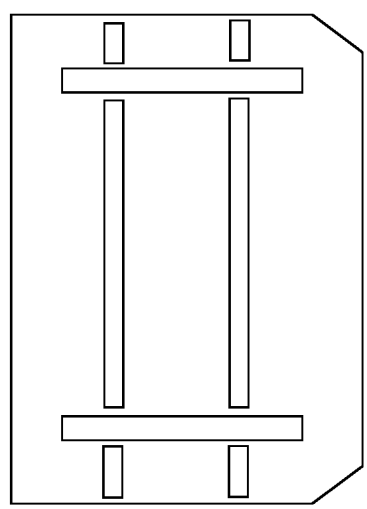
FIG. 7D shows an exemplary back tile cover, according to one embodiment.

As one can see in FIG. 7C, all back covers have similar metallization patterns and can be fabricated in batches. To allow for a flexible configuration, in some embodiments, the pre-laid metallic traces can be insulated from each other (e.g., by depositing insulation film on top of each trace). The insulation film can be removed locally by applying chemical etchant. Alternatively, the insulation film can be strategically deposited based on the desired electrical connection pattern. For example, if it is desired to have all tiles connected in parallel within a multi-tile module, the metallic traces on each back tile cover can be configured such that the top lateral trace electrically couples to the left vertical trace, whereas the bottom lateral trace couples to the right vertical trace. The solid circles in FIG. 7C show the coupling points between the intersecting metallic strips. Alternatively, the metallic traces can be configured such that gaps exist between metallic strips that cross paths, as shown in FIG. 7D. FIG. 7D shows an exemplary back tile cover, according to one embodiment. In FIG. 7D, the lateral metallic strips do not directly intersect the vertical metallic strips, and small gaps exist between two metallic strips that cross paths to ensure that those two metallic strips remain insulated from each other. Electrical coupling at desired intersecting points can be achieved by applying conductive paste or film to fill the gaps.

Because printed metal traces can only exist on the back covers, an additional metal piece is needed to connect a metal trace located on one back cover to another metal trace located on an adjacent back cover. In the example shown in FIG. 7C, short metal tabs can be used to connect the printed metal traces of adjacent back covers. For example, short metal tab 764 connects metal traces 748 and 756, and short metal tab 766 connects metal traces 750 and 758. In some embodiments, these short metal tabs can include Cu tabs that can be bonded to the metal traces using conductive adhesives. Note that these short metal tabs may also be pre-embedded inside tile spacers, which mechanically couple and support adjacent solar roof tiles. A detailed description regarding the tile spacers can be found in U.S. patent application Ser. No. 16/050,994, filed Jul. 31, 2018 and entitled "SOLAR ROOF TILE SPACER WITH EMBEDDED CIRCUITRY," the disclosure of which is incorporated herein by reference in its entirety.

To ensure precise and localized coupling between the two metallic strips or traces that cross paths, in some embodiments, metallic strips or traces that cross multiple tiles (referred to as cross-tile metallic strips) can be partially insulated with only the desired areas exposed. In the scenario where individual metallic strips are used, one can wrap around each individual metallic strip a layer of insulation tape (e.g., polyvinyl fluoride (PVF) tape) with the desired portion of the metallic strips exposed. In the scenario where metallic traces have been pre-printed onto the glass cover, the metallic traces can be coated with an insulation layer (e.g., an organic solderability preservative (OSP) layer). The OSP layer can then be partially etched off to expose desired portions of the metallic traces.

Figure 8:
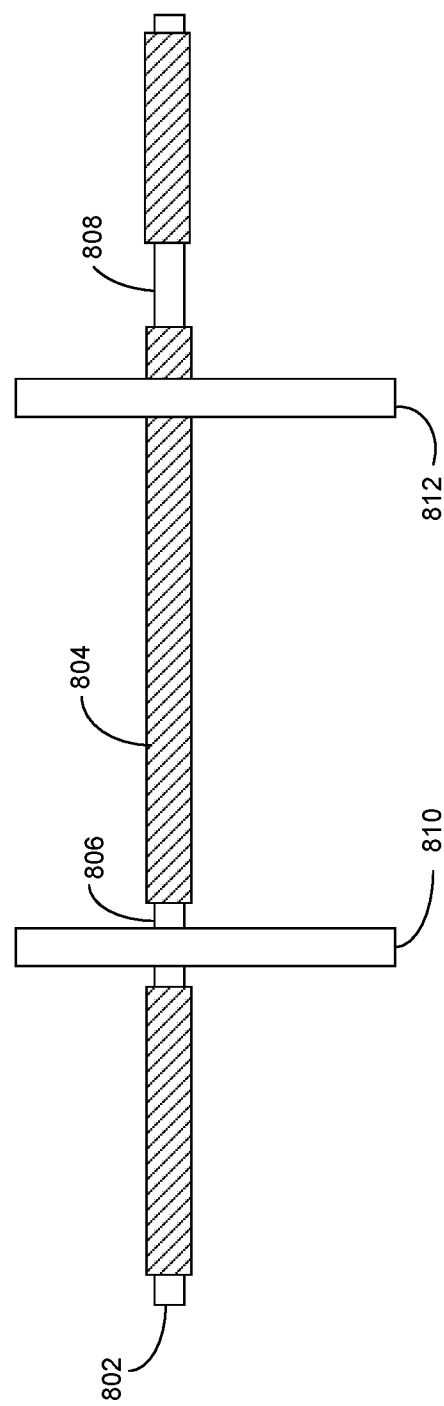
FIG. 8 shows insulated metallic strips with partially exposed portions, according to one embodiment.

FIG. 8 shows insulated metallic strips with partially exposed portions, according to one embodiment. In FIG. 8, metallic strip 802 is partially covered by insulation film 804 with a number of exposed surface regions (e.g., surface regions 806 and 808). On the other hand, metallic strips 810 and 812 have their entire surfaces exposed. Metallic strip 802 intersects metallic strips 810 and 812. More specifically, metallic strip 802 intersects metallic strip 810 at exposed surface region 806, creating a metal-to-metal contact. Consequently, electrical coupling can be created between metallic strips 802 and 810. On the other hand, insulation film 804 covers the portion of metallic strip 802 that intersects metallic strip 812. Consequently, metallic strips 802 and 812 are insulated from each other. By strategically creating openings on the insulation film covering the cross-tile metallic strip, desired electrical interconnections among the metal strips can be achieved. For simplicity of illustration, the insulation films are not always shown in the drawings.

Figure 9A:
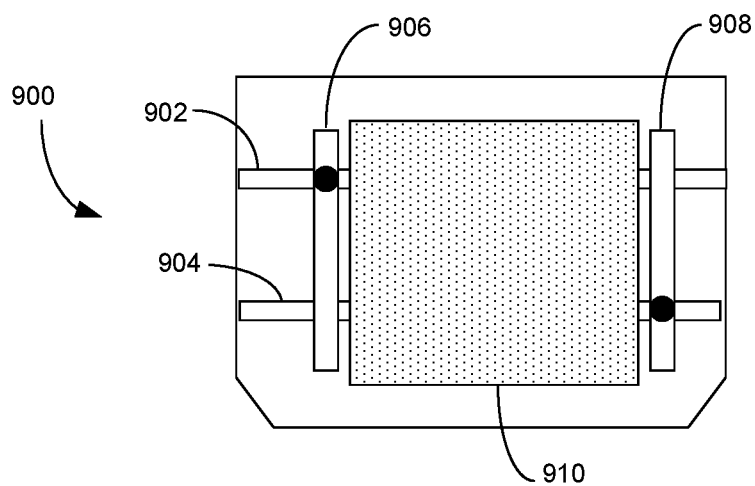
FIG. 9A shows an exemplary back cover of a solar roof tile partially covered by encapsulant, according to one embodiment.

Like conventional photovoltaic panels, a photovoltaic roof tile can include both a front encapsulant layer and a back encapsulant layer, which facilitate the encapsulation of the cascaded string between the front and back covers of the photovoltaic roof tile. In some embodiments, a back encapsulant layer, which is typically insulating, can be inserted between the back cover of a solar roof tile and a cascaded string. Such an insulation layer may interfere with the electrical coupling between the cascaded string and the pre-laid circuitry. To enable such electrical coupling with the presence of the back encapsulant layer, in some embodiments, the back encapsulant layer can cover only a center region of the back cover, leaving surrounding regions uncovered. FIG. 9A shows an exemplary back cover of a solar roof tile partially covered by encapsulant, according to one embodiment. In FIG. 9A, back cover 900 can include a pre-laid circuit, which includes pre-laid metallic strips 902, 904, 906 and 908. Metallic strips 902 and 904 are cross-tile metallic strips, whereas metallic strips 906 and 908 can be used for coupling to electrodes (e.g., edge busbars) of the cascaded string. Encapsulant layer 910 can cover the center region of back cover 900, leaving the border regions, including metallic strips 906 and 908 uncovered. As a result, encapsulant layer 910 does not interfere with the electrical coupling between metallic strips 906 and 908 and the electrodes of the overlying cascaded string, which is not shown in FIG. 9A.

Figure 9B:
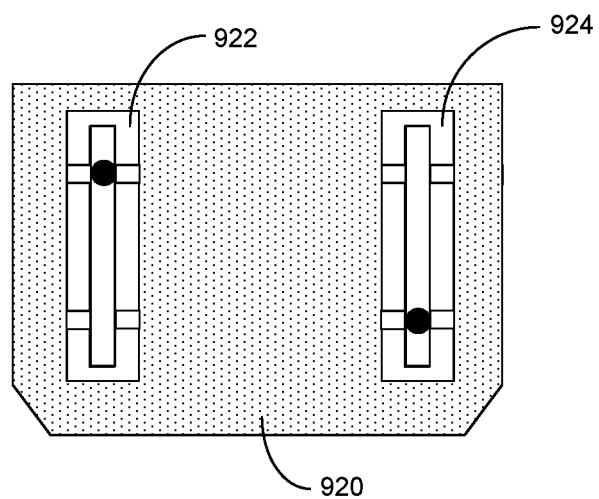
FIG. 9B shows an exemplary back cover of a solar roof tile partially covered by encapsulant, according to one embodiment.

Other configurations of the encapsulant layer can also be possible. FIG. 9B shows an exemplary back cover of a solar roof tile partially covered by encapsulant, according to one embodiment. In FIG. 9B, encapsulant layer 920 can include a number of openings (e.g., openings 922 and 924) to expose metallic strips that need to couple to electrodes of a cascaded string. Note that, because the encapsulant typically can expand during lamination, it can be desirable to make the opening slightly larger than the corresponding metallic strips.

In alternative embodiments, there is no encapsulant between the back glass cover and the cascaded string, and the pre-laid circuit on the back glass cover can directly couple to electrodes of the cascaded string Eliminating the encapsulant layer between the back glass cover and the cascaded string not only can ensure proper electrical coupling between the pre-laid circuit on the back cover and the cascaded string, but also can simplify the fabrication process and reduce cost. In such an approach, only a single encapsulant layer is needed during fabrication of the photovoltaic roof tile. More specifically, such a single encapsulant layer can be inserted between the cascaded string and the front glass cover, covering the front surface of the cascaded string. The back surface of the cascaded string can be in direct contact with the back cover of the photovoltaic roof tile.

FIG. 9C shows the cross section of a photovoltaic roof tile prior to lamination, according to one embodiment. Photovoltaic roof tile 940 can include front cover 942 and back cover 944. Photovoltaic structures, such as a cascaded string 946, can be placed on back cover 944 so that the back surface (i.e., the surface that faces sway from the sun) of the photovoltaic structures is in direct contact with back cover 944. In some embodiments, back cover 944 can include a pre-laid circuit (not shown in FIG. 9C) for facilitating inter-tile electrical coupling, and electrodes of the photovoltaic structures can be in contact with the pre-laid circuit. Photovoltaic roof tile 940 can also include a front encapsulant layer 948 positioned between the photovoltaic structures and front cover 942.

FIG. 9D shows the cross section of photovoltaic roof tile 940 after lamination, according to one embodiment. After lamination, front encapsulant layer 948 can expand to fill any void between front cover 942 and back cover 944. More specifically, front encapsulant layer 948 can cover the entirety of the interior surface of front cover 942 and cover remaining portions of the interior surface of back cover 944 that are not covered by cascaded string 946. As a result, cascaded string 946 can be sealed between front cover 942 and back cover 944. Note that, in addition to a cascaded string, the photovoltaic structures encapsulated between front cover 942 and back cover 944 can have different configurations depending on the design of photovoltaic roof tile 940. For example, the photovoltaic structures may include individual solar cells as shown in FIGS. 4A and 4B.

Fabrication of a Photovoltaic Roof Tile

Figure 10:
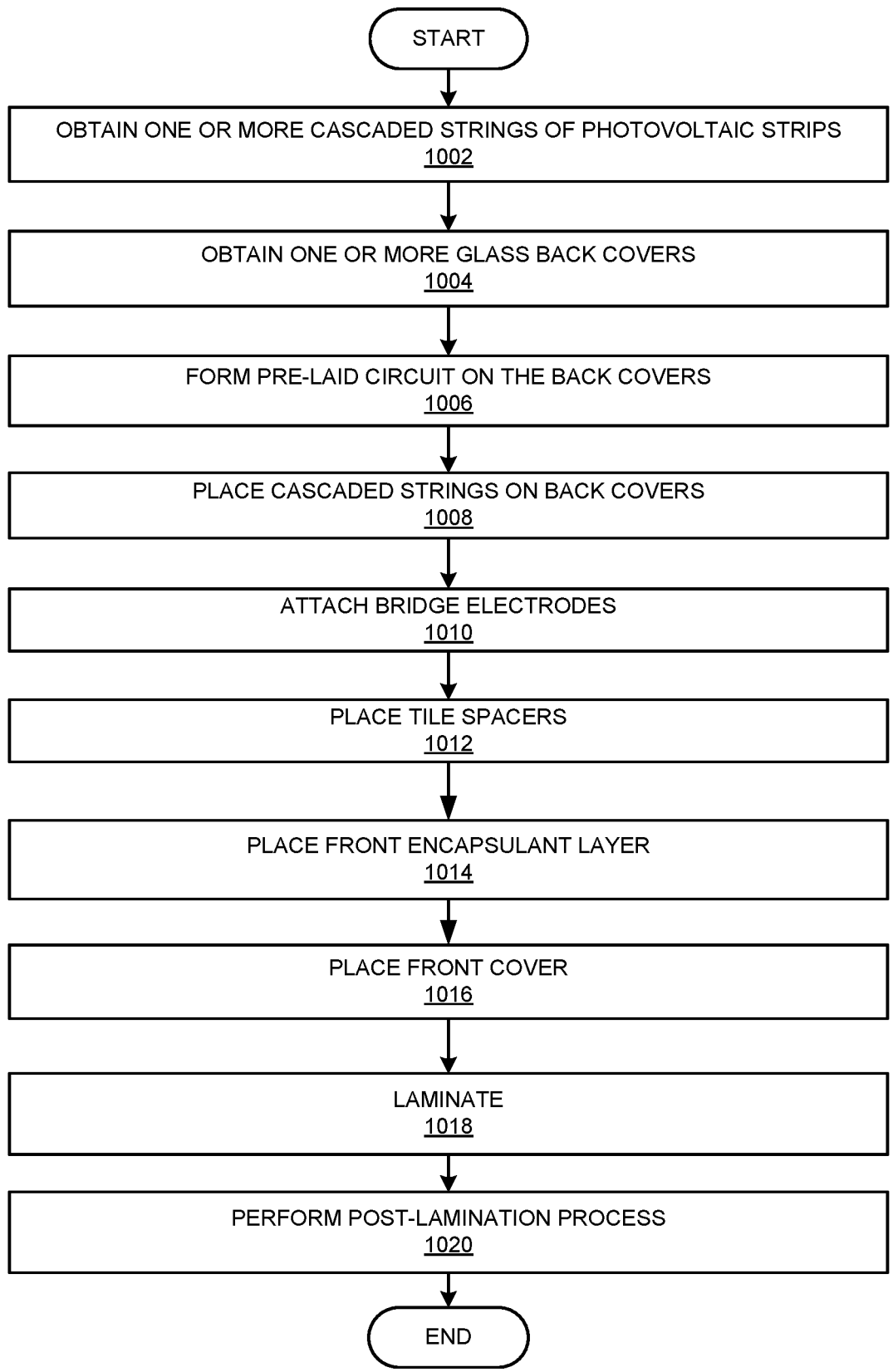
FIG. 10 presents a flowchart illustrating an exemplary process for fabricating a photovoltaic tile module, according to an embodiment.

FIG. 10 presents a flowchart illustrating an exemplary process for fabricating a photovoltaic tile module, according to an embodiment. The photovoltaic tile module can be a single-tile module or a multi-tile module. During fabrication, one or more cascaded strings of photovoltaic strips can be obtained (operation 1002). The photovoltaic strips can be obtained by dividing a standard square or pseudo-square solar cell into multiple pieces, and a string of strips can be formed by cascading multiple strips at the edges. The cascading forms a serial connection among the strips. In some embodiments, each individual solar roof tile may include one string, and each string can include six cascaded strips. Detailed descriptions about the formation of a cascaded string of photovoltaic strips can be found in U.S. patent application Ser. No. 14/826,129, entitled "PHOTOVOLTAIC STRUCTURE CLEAVING SYSTEM," filed Aug. 13, 2015; U.S. patent application Ser. No. 14/866,776, entitled "SYSTEMS AND METHODS FOR CASCADING PHOTOVOLTAIC STRUCTURES," filed Sep. 25, 2015; U.S. patent application Ser. No. 14/804,306, entitled "SYSTEMS AND METHODS FOR SCRIBING PHOTOVOLTAIC STRUCTURES," filed Jul. 20, 2015; U.S. patent application Ser. No. 14/866,806, entitled "METHODS AND SYSTEMS FOR PRECISION APPLICATION OF CONDUCTIVE ADHESIVE PASTE ON PHOTOVOLTAIC STRUCTURES," filed Sep. 25, 2015; and U.S. patent application Ser. No. 14/866,817, entitled "SYSTEMS AND METHODS FOR TARGETED ANNEALING OF PHOTOVOLTAIC STRUCTURES," filed Sep. 25, 2015; the disclosures of which are incorporated herein by reference in their entirety.

In some embodiments, instead of conductive paste, electrical and mechanical bonding between the adjacent strips at their corresponding edges can be achieved via adhesive conductive films. Detailed descriptions about the bonding of adjacent photovoltaic strips using adhesive conductive films can be found in U.S. patent application Ser. No. 16/007,599, entitled "CASCADED SOLAR CELL STRING USING ADHESIVE CONDUCTIVE FILM," filed Jun. 13, 2018, the disclosure of which is incorporated herein by reference in its entirety.

One or more glass back covers for solar roof tiles can be obtained (operation 1004), and pre-laid circuit can be formed on the back covers (operation 1006). In some embodiments, the pre-laid circuit can be formed by attaching (e.g., using an adhesive) individual metallic strips at desired locations on the back covers. To prevent unwanted electrical coupling, a metallic strip running across multiple cascaded strips or even multiple tiles can be wrapped by an insulation film with openings at one or more desired locations. In alternative embodiments, the pre-laid circuit can be formed by printing, or depositing using other metallization techniques (e.g., evaporation, sputtering, plating, etc.) metallic traces at desired locations of the back covers. Similarly, a metallic trace that runs across multiple cascaded strips can be covered by an insulation film with one or more openings formed at desired locations.

The previously prepared cascaded strings can then be placed directly onto the back covers (operation 1008). In some embodiments, a robotic arm with vacuum-enabled wafer pickers can pick up the cascaded strings and lay them on desired locations of the back covers. The cascaded strings should be arranged in such a way that the bottom edge busbar of a cascaded string overlaps a corresponding metallic strip or trace of the pre-laid circuit. Various alignment techniques (e.g., laser vision or computer vision) can be used to align the cascaded string. The coupling between the metallic strip or trace in the pre-laid circuit and the edge busbar of the cascaded string can be achieved using electrically conductive adhesive (ECA). Alternatively, no adhesive is needed because the rigid coupling between the front and back glass covers can sufficiently secure the metal-to-metal contact.

Subsequently, a bridge electrode can be attached to each cascaded string (operation 1010). More specifically, an edge of the back surface of the bridge electrode can stack on the top edge busbar of the cascaded string. If the bridge electrode includes an edge busbar on its back surface, such an edge busbar can overlap the top edge busbar of the cascaded string in a way similar to the cascading of two adjacent strips. Moreover, the contact pads on the other edge of the back surface can overlap a corresponding metallic strip or trace of the pre-laid circuit. The coupling between the bridge electrode and the edge busbar of a cascaded string can be similar to the coupling between two adjacent photovoltaic structures, which can involve a conductive paste. On the other hand, the coupling between the contact pads of the bridge electrode and the pre-laid circuit can be similar to the coupling between the bottom edge busbar of the cascaded string and the pre-laid circuit, which can involve ECA. In addition, it is also possible to not use adhesive at all, but to rely instead on the metal-to-metal contact for electrical coupling.

If a multi-tile module is being fabricated, tile spacers can be placed between adjacent tiles (operation 1012). The tile spacers can be designed in such a way that they can accommodate metallic strips running across the multiple tiles. A front encapsulant layer can then be placed on top of the cascaded string and the bridge electrode (operation 1014), and front glass covers can be placed on top of the front encapsulant layer (operation 1016). A lamination operation can be performed to encapsulate the cascaded strings along with the bridge electrodes between the front and back covers (operation 1018). A post-lamination process (e.g., trimming of overflowed encapsulant and attachment of the junction box and other roofing components) can then be performed to complete the fabrication of a PV roof tile (operation 1020). In some embodiments, a junction box can access the pre-laid circuit via a through hole located on the glass back cover. A detailed description of the junction box and the coupling between the junction box and the inter-tile electrical connection can be found in U.S. patent application Ser. No. 15/905,551, entitled "SYSTEM AND METHOD FOR COUPLING JUNCTION BOX TO SOLAR ROOF TILES," filed Feb. 26, 2018, the disclosure of which is incorporated herein by reference in its entirety.

Figure 11:
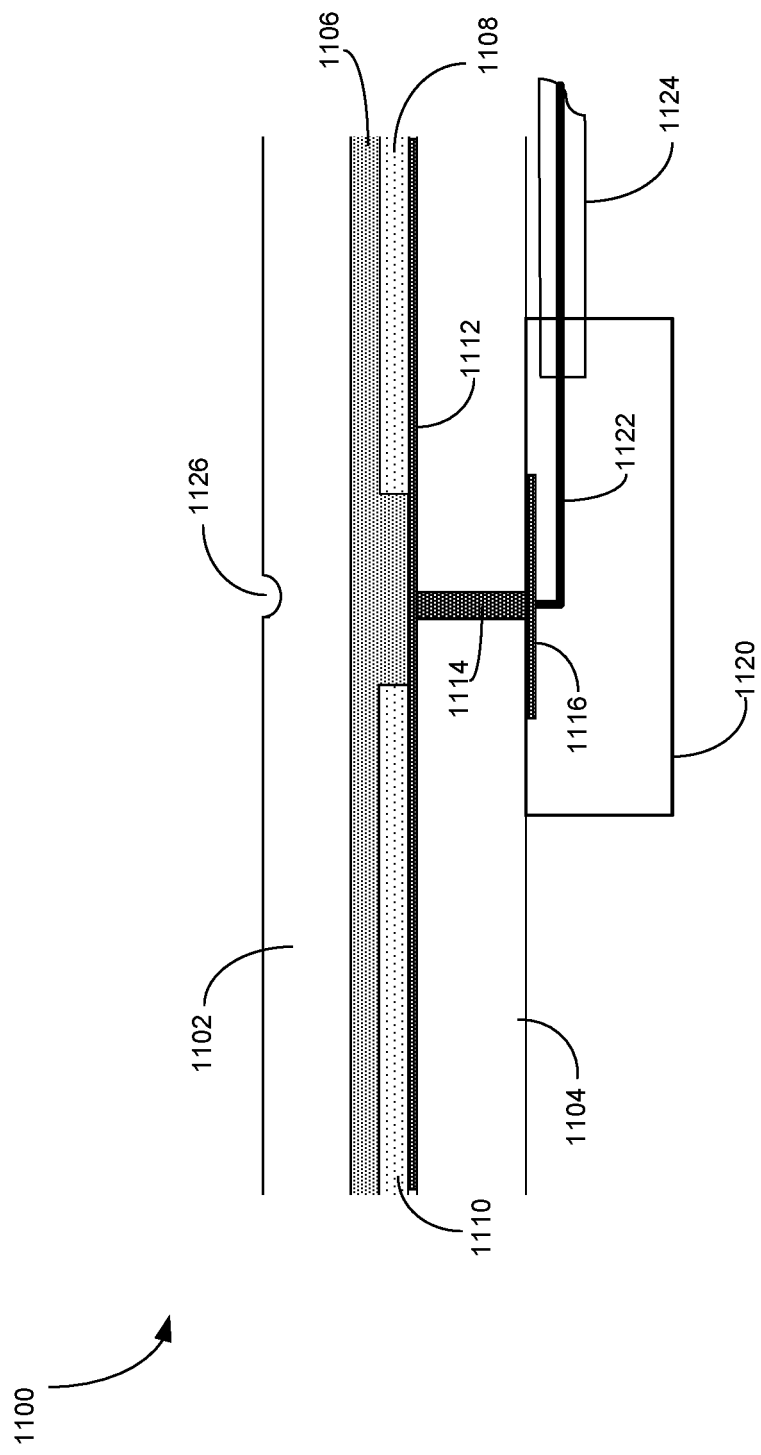
FIG. 11 shows a partial cross-sectional view of a multi-tile module, according to one embodiment.

In addition to using relatively large through holes and specially designed attachment pads for junction-box access, in some embodiments, metal-coated vias can be used to allow for the pre-laid circuit to make electrical connections to the external junction box. FIG. 11 shows a partial cross-sectional view of a multi-tile module, according to one embodiment. In FIG. 11, multi-tile module 1100 can include front glass cover 1102, back glass cover 1104, front encapsulant layer 1106, and cascaded strings 1108 and 1110. Multi-tile module 1100 can also include pre-laid circuit 1112 attached to or directly deposited on back cover 1104. As shown in FIG. 11, pre-laid circuit 1112 can electrically couple cascaded strings 1108 and 1110.

Multi-tile module 1100 can also include a junction box 1120 attached to the exterior surface of back cover 1104. To facilitate electrical coupling between wire 1122 within junction box 1120 and pre-laid circuit 1112, in some embodiments, via 1114 can be formed at a desired location on back cover 1104. More specifically, via 1114 can be formed by drilling (e.g., using a physical or chemical method) a relatively small hole (e.g., a few millimeters in diameter) at a desired location followed by filling the hole with electroplated Cu. Metal-to-metal contact can be made between via 1114 and pre-laid circuit 1112. In some embodiment, metal trace 1116 can also be formed on the exterior surface of back cover 1104. Metal trace 1116 can be coupled, simultaneously, to via 1114 and wire 1122, thus facilitating electrical coupling between wire 1122 and pre-laid circuit 1112. FIG. 11 also shows that the portion of wire 1122 outside of junction box 1120 can be protected by jacket 1124 from weather elements.

Note that, in the example shown in FIG. 11, the multi-tile module can include a single front cover and a single back cover for the multiple tiles, instead of using separate covers. In such a scenario, tile spacers are no longer needed. Moreover, to simulate the effect of separate tiles, front cover 1102 can include a groove 1126.

Figure 12:
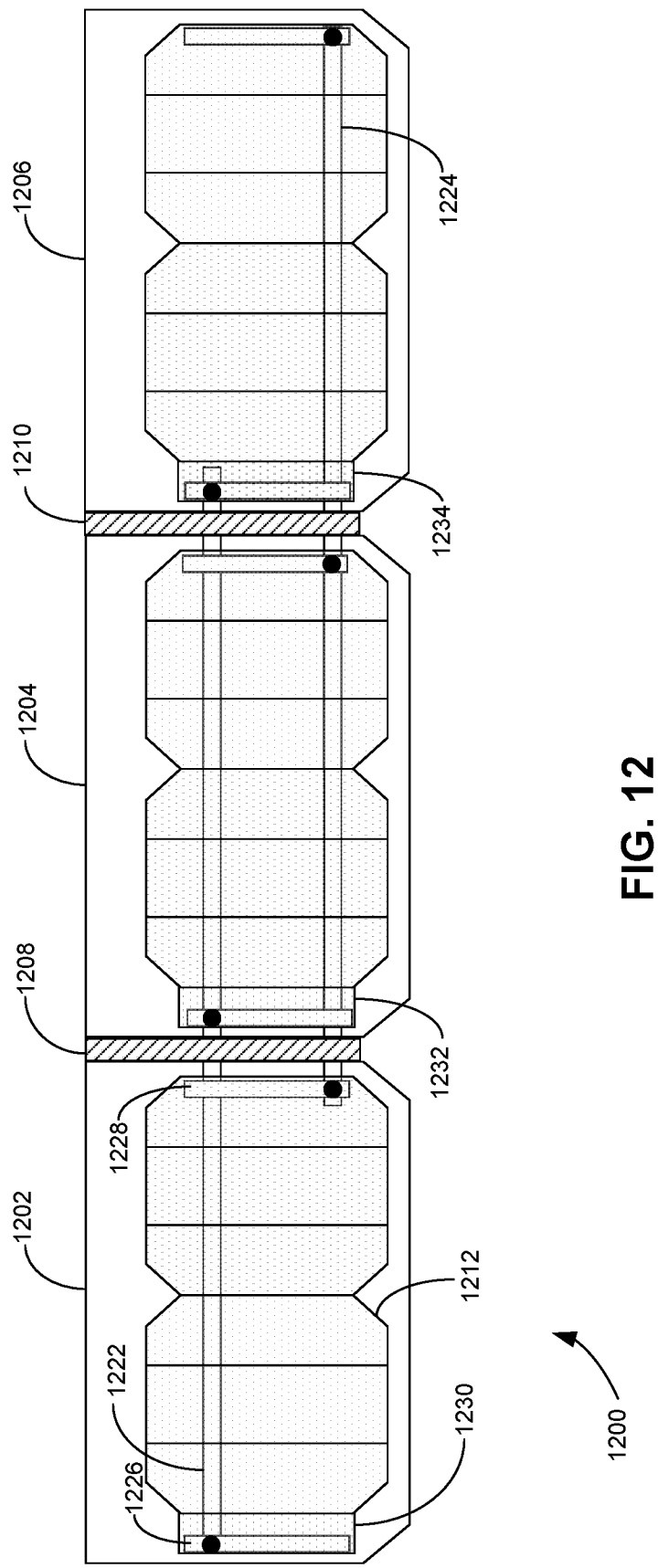
FIG. 12 illustrates an exemplary fabricated multi-tile module, according to one embodiment.

FIG. 12 illustrates an exemplary fabricated multi-tile module, according to one embodiment. Multi-tile module 1200 can include a number of tiles (e.g., tiles 1202, 1204, and 1206) that are placed adjacent to each other in the lateral direction, with neighboring tiles being mechanically coupled to each other via a tile spacer. For example, tile spacer 1208 mechanically couples tiles 1202 and 1204, and tile spacer 1210 mechanically couples tiles 1204 and 1206. Each tile can include a cascaded string of photovoltaic structures encapsulated between front and back covers. For example, tile 1202 can include cascaded string 1212. Note that the photovoltaic structures within each cascaded string are also arranged to be adjacent to one another in the lateral direction.

Each tile can include a front tile cover and a front encapsulant layer, which are transparent and are not labeled in FIG. 12. For illustration purposes, the cascaded strings (e.g., cascaded string 1212) can be shown as semi-transparent to reveal the pre-laid circuit on the back covers of the tiles. Note that the cascaded strings are directly laid onto the pre-laid circuit and the back covers, without an encapsulant layer in between. The pre-laid circuit can include a number of metallic strips or traces that have been directly deposited onto the interior surface of the back covers. In the example shown in FIG. 12, the pre-laid circuit includes two cross-tile metallic strips (e.g., metallic strips 1222 and 1224) that run across multiple tiles in the lateral direction. The pre-laid circuit can also include a number of metallic strips or traces that run in the vertical direction (e.g., metallic strips 1226 and 1228). These vertical metallic strips or traces underlap the bottom edge busbar of the cascaded strings and the contact pads of the bridge electrodes (e.g., bridge electrodes 1230, 1232, and 1234). For example, vertical metallic strip 1226 underlaps contact pads of bridge electrode 1230, and vertical metallic strip 1228 underlaps the bottom edge busbar of cascaded string 1212.

In the example shown in FIG. 12, pre-laid circuit is used for inter-tile coupling. In practice, it is also possible to use standalone metallic strips that have been loosely placed onto the back covers for inter-tile electrical coupling. In such a scenario, those standalone metallic strips need to be placed carefully onto the back covers during fabrication. Alternatively, the fabrication process can start with placing the cascaded strings upside down onto the front encapsulant layer and front covers. Standalone metallic strips can then be carefully placed onto the back side of the cascaded strings, achieving desired coupling to electrodes of the cascaded strings. The glass back covers can then be placed directly onto those standalone metallic strips and cascaded strings, directly contacting the back surface of the cascaded strings. After lamination, the front encapsulant layer expands and is cured, sealing the cascaded strings between the front and back covers.

The foregoing descriptions of various embodiments have been presented only for purposes of illustration and description. They are not intended to be exhaustive or to limit the present system to the forms disclosed. Accordingly, many modifications and variations will be apparent to practitioners skilled in the art. Additionally, the above disclosure is not intended to limit the present system.

What is claimed is:

1. A photovoltaic roof tile, comprising:
   a front glass cover;
   a back glass cover;
   a plurality of photovoltaic structures positioned between the front glass cover and the back glass cover, the plurality of photovoltaic structures comprising a plurality of electrodes;
   a first encapsulant layer positioned between the front glass cover and the plurality of photovoltaic structures;
   a pre-laid circuit comprising:
     a first plurality of metallic strips electrically coupled to one or more of the plurality of electrodes, wherein two or more metallic strips of the first plurality of metallic strips extend across a portion of a first region of a surface of the back glass cover, an area of the first region being greater than a total area of the surface of the back glass cover covered by the two or more metallic strips of the first plurality of metallic strips;
     a second plurality of metallic strips in direct contact with the back glass cover; and
     an electrical coupling spanning a gap between a first metallic strip of the first plurality of metallic strips and a second metallic strip of the second plurality of metallic strips to electrically couple the first and second metallic strips; wherein the first plurality of metallic strips are positioned between the second plurality of metallic strips and the plurality of photovoltaic structures; and
   a second encapsulant layer positioned between the back glass cover and the plurality of photovoltaic structures, the second encapsulant layer extending across a second region of the surface of the back glass cover and leaving the first region of the surface of the back glass cover free of the second encapsulant layer.

2. The photovoltaic roof tile of claim 1, wherein the second plurality of metallic strips extend out of the photovoltaic roof tile and into one or more photovoltaic roof tiles adjacent to the photovoltaic roof tile.

3. The photovoltaic roof tile of claim 1, wherein the electrical coupling is formed by a conductive paste or a conductive film.

4. The photovoltaic roof tile of claim 3, wherein the second encapsulant layer defines an opening making up at least a portion of the first region, the opening having a shape that matches a shape of one of the two or more metallic strips of the first plurality of metallic strips.

5. The photovoltaic roof tile of claim 1, wherein the second encapsulant layer does not extend into a third region of the surface of the back glass cover that is separate and distinct from the first region and wherein the plurality of photovoltaic structures comprises a second plurality of electrodes extending across the third region.

6. The photovoltaic roof tile of claim 3, wherein a length of each metallic strip of the first plurality of metallic strips is at least half as long as a length of the back glass cover.

7. A photovoltaic roof tile module, comprising:
   a plurality of photovoltaic roof tiles mechanically and electrically coupled to each other, wherein a respective photovoltaic roof tile comprises:
   a front glass cover;
   a back glass cover;
   a plurality of photovoltaic structures positioned between the front glass cover and the back glass cover, the plurality of photovoltaic structures comprising a plurality of electrodes; and
   a first encapsulant layer positioned between the front glass cover and the plurality of photovoltaic structures;
   a pre-laid circuit comprising:
      a first plurality of metallic strips, wherein two or more metallic strips of the first plurality of metallic strips are electrically coupled to two or more of the plurality of electrodes;
      a second plurality of metallic strips in direct contact with the back glass cover, wherein the first plurality of metallic strips are positioned between the second plurality of metallic strips and the plurality of photovoltaic structures; and
      an electrical coupling spanning a gap between a first metallic strip of the first plurality of metallic strips and a second metallic strip of the second plurality of metallic strips to electrically couple the first metallic strip to the second metallic strip; and
   a second encapsulant layer positioned between the back glass cover and the plurality of photovoltaic structures, the second encapsulant layer shaped so that it insulates a first portion of the pre-laid circuit from the plurality of photovoltaic structures and leaves a second portion of the pre-laid circuit, which includes the two or more metallic strips of the first plurality of metallic strips, uninsulated from at least a portion of the plurality of photovoltaic structures.

8. The photovoltaic roof tile module of claim 7, wherein a respective photovoltaic structure comprises a first edge busbar positioned near an edge of a first surface and a second edge busbar positioned near an opposite edge of a second surface, and wherein the plurality of photovoltaic structures are arranged in such a way that the first edge busbar of a first photovoltaic structure overlaps the second edge busbar of an adjacent photovoltaic structure, thereby resulting in the plurality of photovoltaic structures forming a serially coupled string.

9. The photovoltaic roof tile module of claim 7, wherein a portion of the first metallic strip is covered by an insulation film that prevents metal-to-metal contact between the first metallic strip of the first plurality of metallic strips and a third metallic strip of the second plurality of metallic strips.

10. The photovoltaic roof tile module of claim 7, wherein the second encapsulant layer covers a larger portion of the back glass cover than it leaves exposed.

11. The photovoltaic roof tile module of claim 7, wherein the electrical coupling is formed by a conductive paste or a conductive film.

12. The photovoltaic roof tile module of claim 11, wherein the plurality of photovoltaic structures are electrically coupled to the second plurality of metallic strips by way of one or more metallic strips of the first plurality of metallic strips.

13. The photovoltaic roof tile module of claim 7, wherein one or more metallic strips of the second plurality of metallic strips extend out of a first photovoltaic roof tile and into a second photovoltaic roof tile photovoltaic roof tiles.

14. The photovoltaic roof tile module of claim 13, wherein the second encapsulant layer defines one or more openings that leave the second portion of the prelaid circuit uninsulated from the plurality of photovoltaic structures.

\* \* \* \* \*